United States Patent
Zhang et al.

(10) Patent No.: US 8,507,379 B2
(45) Date of Patent: Aug. 13, 2013

(54) SEMICONDUCTOR DEVICE AND MANUFACTURING METHOD THEREOF

(75) Inventors: Yiying Zhang, Beijing (CN); Qiyang He, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 54 days.

(21) Appl. No.: 13/240,820

(22) Filed: Sep. 22, 2011

(65) Prior Publication Data

US 2012/0286335 A1 Nov. 15, 2012

(30) Foreign Application Priority Data

May 12, 2011 (CN) .......................... 2011 1 0121749

(51) Int. Cl.
| | | |
|---|---|---|
| *H01L 21/44* | (2006.01) | |
| *H01L 23/48* | (2006.01) | |
| *H01L 21/441* | (2006.01) | |

(52) U.S. Cl.
USPC ........... 438/652; 438/656; 438/211; 257/750; 257/763; 257/E21.477; 257/E23.011

(58) Field of Classification Search
USPC ................ 438/652, 656, 211; 257/750, 763, 257/E21.477, E23.011
See application file for complete search history.

(56) References Cited

U.S. PATENT DOCUMENTS

| 7,700,466 B2* | 4/2010 | Booth et al. ................ 438/517 |
|---|---|---|
| 2008/0157365 A1* | 7/2008 | Ott et al. .................... 257/750 |
| 2011/0156107 A1* | 6/2011 | Bohr et al. .................. 257/288 |
| 2012/0119204 A1* | 5/2012 | Wong et al. ................. 257/43 |

OTHER PUBLICATIONS

"The Use of Selective Electroless Metal Deposition for Micron Size Contact Fill", by C.S. Wei, D.B. Fraser, A.T. Wu, M. Paunovic and C.H. Ting, Electron Devices meeting, 1988. IEDM'88. Technical Digest., International, p. 446-449.

"Novel Approach to Reduce Source/Drain Series Resistance in High Performance CMOS Devices Using Self-Aligned CoWP Process for 45nm Node UTSOI Transistors with 20nm Gate Length", by James Pan, Anna Topol, Ingrid Shao, et al , 2006 Symposium on VLSA Technology Digest of Technical Papers, p. 184-185.

\* cited by examiner

*Primary Examiner* — Luan C Thai

(74) *Attorney, Agent, or Firm* — Koppel, Patrick, Heybl & Philpott

(57) ABSTRACT

A semiconductor device and a manufacturing method thereof are disclosed. The method comprises: providing a substrate with a first dielectric layer and a gate, wherein the gate is embedded in the first dielectric layer and an upper portion of the gate is an exposed first metal; and covering only the exposed first metal with a conductive material that is harder to be oxidized than the first metal by a selective deposition. An advantage of the present invention is that the metal of the upper surface of the gate is prevented from being oxidized by covering the metal gate with the conductive material that is relatively harder to be oxidized, thereby facilitating the formation of an effective electrical connection to the gate.

19 Claims, 5 Drawing Sheets

300

SEMICONDUCTOR DEVICE AND MANUFACTURING METHOD THEREOF

CROSS-REFERENCE TO RELATED APPLICATIONS

This application claims priority to Chinese Patent Application No. 201110121749.8, filed on May 12, 2011 and entitled "SEMICONDUCTOR DEVICE AND MANUFACTURING METHOD THEREOF", which is incorporated by reference herein in its entirety.

BACKGROUND OF THE INVENTION

1. Field of the Invention

The present invention relates to semiconductor techniques, and more specifically, to a semiconductor device and a manufacturing method thereof.

2. Description of the Related Art

With the development of integrated circuit technology, the dimension of a semiconductor device has become increasingly smaller. In order to control short-channel effect, a smaller device dimension requires further improving gate capacitance. Generally, gate capacitance is improved by decreasing the thickness of a gate dielectric layer (usually, silicon oxide ($SiO_2$)) that is between a gate and a substrate. However, this may increase gate leakage current and decrease the device reliability. Moreover, with the shrinkage of critical dimension, it is difficult to further reduce the thickness of the gate dielectric layer.

Thus, in the present very large scale integrated circuit (VLSI) process, the high dielectric constant (high-K) metal gate (HK-MG) scheme has gradually become a mainstream technology. In the HK-MG scheme, a material of high dielectric constant, which has a higher dielectric constant and a better field effect characteristic than silicon oxide, is used as the material of the gate dielectric layer instead of silicon oxide. In order to be compatible with the high-K material, a metal gate is usually employed to replace a traditional polysilicon gate.

Currently, an Al gate is mostly used as the metal gate in the HK-MG scheme. During the manufacturing process of a semiconductor device, for electrical connection of the gate, generally, a dielectric layer is firstly deposited on the gate and then etched to form a contact hole connected to the gate. Thus, the contact hole etching needs to be performed until reaching the surface of the Al gate. However, the inventor has found that the surface of aluminium is easy to be oxidized during the process of depositing a dielectric layer on the gate, which results in the formation of an aluminium oxide ($Al_2O_3$) film on the surface of aluminium. This aluminium oxide film interrupts the contact hole etching such that the etching stops on the aluminium oxide film and cannot reach aluminium in the gate, thereby failing to form an effective electrical connection for the Al gate.

FIGS. 1A-1C are diagrams illustrating the above process for forming a gate contact hole according to the conventional HK-MG technique.

Firstly, as shown in FIG. 1A, a substrate 102 with a first dielectric layer 110 and a gate 104 is provided, wherein the gate 104 is embedded in the first dielectric layer 110. The substrate 102 can be silicon or any other suitable material. The first dielectric layer 110 on the substrate 102 can be formed from any suitable material, such as silicon oxide. Optionally, a stop layer (not shown) formed from a material such as silicon nitride can be formed between the substrate 102 and the first dielectric layer 110, which can help control the etching of contact holes for the source and the drain. A gate dielectric layer 106 of high-k can be formed between the gate 104 and the substrate 102, which can be formed from any suitable high-k material such as hafnium oxide or zirconium oxide. An isolating layer (not shown) formed from a material such as titanium or titanium nitride can be optionally formed between the gate 104 and the gate dielectric layer 106. Side wall spacers 108 are usually provided on both sides of the gate 104. Optionally, the gate 104 and an upper surface of the first dielectric layer 110 can be flush with each other by way of processes like chemical mechanical polishing (CMP). The gate 104 can be formed from any suitable metal and/or a combination of metals, and the upper portion of the gate 104 is aluminium in this example. In order to obtain the structure shown in FIG. 1A, either the gate-first scheme or the gate-last scheme can be employed. Since these two schemes are known by one of ordinary skill in the relevant art, the details thereof will be omitted for the sake of not obscuring the major ideas of the present invention.

In the conventional process, after obtaining the structure shown in FIG. 1A, a second dielectric layer 120 is deposited thereon, as shown in FIG. 1B. Then, the second dielectric layer 120 is etched to form a gate contact hole 130, as shown in FIG. 1C. However, during the process of depositing the second dielectric layer 120, or if the structure shown in FIG. 1A is exposed to air for a long time, the metal (Al in this example) of the upper surface of the gate 104 is prone to be oxidized, thereby forming an oxidation film (aluminium oxide film in this example) 122 on the upper surface of the gate. Usually, the contact hole etching process mainly for removing the material of the second dielectric layer cannot remove this oxidation film 122. Therefore, during the process of the contact hole etching in FIG. 1C, the etching stops at this oxidation film 122 and cannot continue, and consequently the contact hole fails to reach the aluminium in the gate. Moreover, since the conductivity of aluminium oxide is very poor, the gate cannot be effectively electrically connected to the contact that is filled in the contact hole and thus suffers the "open" issue. This issue is not limited to Al gate. Actually, the same issue will occur so long as the metal of the surface of the gate metal is easy to be oxidized.

Therefore, it is necessary to propose a new technology to address the above issue.

SUMMARY OF THE INVENTION

An object of the present invention is to provide a method for preventing a metal gate from being oxidized during the manufacturing of a semiconductor device.

According to an aspect of the present invention, there is provided a method for manufacturing a semiconductor device, comprising: providing a substrate with a first dielectric layer and a gate, wherein the gate is embedded in the first dielectric layer and an upper portion of the gate is an exposed first metal; and covering only the exposed first metal with a conductive material that is harder to be oxidized than the first metal by a selective deposition.

Optionally, the method further comprises a step of depositing a second dielectric layer such that the second dielectric layer covers the first dielectric layer as well as the gate on which the conductive material has been deposited.

Optionally, the conductive material is selected to be substantially not oxidized in an atmosphere for depositing the second dielectric layer.

Optionally, the method further comprises etching the second dielectric layer to form a contact hole that exposes the conductive material.

Optionally, the first metal is aluminium.

Optionally, the conductive material is one of the following materials: cobalt, an alloy of cobalt and tungsten, an alloy of cobalt and molybdenum, an alloy of cobalt and phosphorus, an alloy of molybdenum and phosphorus, an alloy of cobalt, tungsten and phosphorus, an alloy of cobalt, molybdenum and phosphorus, palladium, or nickel.

Optionally, the conductive material has a thickness of 100 Å-500 Å.

Optionally, the first dielectric layer is flush with the upper surface of the gate.

Optionally, the step of depositing the conductive material is performed under a situation where the surface of the first metal is not oxidized.

Optionally, the conductive material is selectively deposited by using a selective electroless metal deposition technique.

Optionally, the step of providing the substrate with the first dielectric layer and the gate comprises providing sidewall spacers on opposite sides of the gate.

According to another aspect of the present invention, there is provided a semiconductor device, comprising: a substrate; a metal gate and a first dielectric layer on the substrate, wherein the metal gate is embedded in the first dielectric layer and an upper portion of the metal gate is a first metal; a conductive material that covers an upper surface of the metal gate, wherein the conductive material is harder to be oxidized than the first metal; a second dielectric layer that covers the first dielectric layer and the conductive material; and a conductive contact that penetrates through the second dielectric layer and is connected to the conductive material.

Optionally, the conductive material is selected to be substantially not oxidized in an atmosphere for depositing the second dielectric layer.

Optionally, the first dielectric layer is flush with the upper surface of the metal gate.

Optionally, the first metal is aluminium.

Optionally, the conductive material is one of the following materials: cobalt, an alloy of cobalt and tungsten, an alloy of cobalt and molybdenum, an alloy of cobalt and phosphorus, an alloy of molybdenum and phosphorus, an alloy of cobalt, tungsten and phosphorus, an alloy of cobalt, molybdenum and phosphorus, palladium, or nickel.

Optionally, the conductive material has a thickness of 100 Å-500 Å.

Optionally, sidewall spacers are provided on opposite sides of the metal gate.

An advantage of the present invention is that, the metal of the upper surface of the gate can be prevented from being oxidized by covering the metal gate with a conductive material that is hard to be oxidized, thereby facilitating the formation of an effective electrical connection to the gate.

BRIEF DESCRIPTION OF THE DRAWINGS

Further features of the present invention and advantages thereof will become apparent from the following detailed description of exemplary embodiments according to the present invention with reference to the accompanying drawings. In the figures.

DESCRIPTION OF THE EMBODIMENTS

Figure 1A:
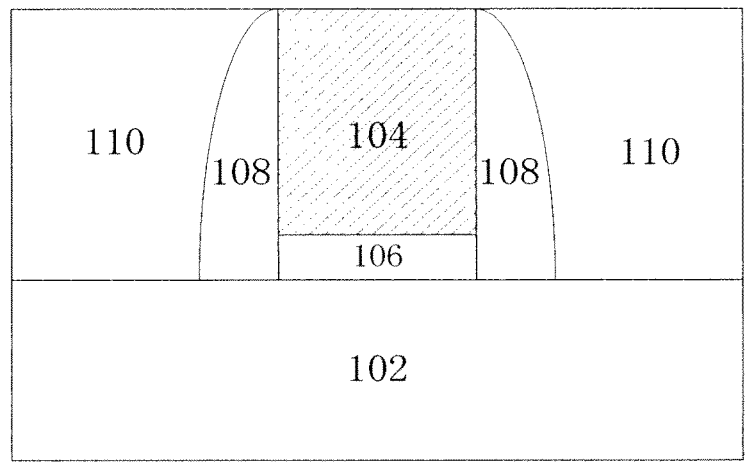
FIGS. 1A-1C are diagrams showing a process for forming a gate contact hole according to the conventional HK-MG process.

One or more embodiments of the present invention will be described below. It should be noted that, in order to provide a concise and brief description of the embodiments, not all features practically implemented are described in this specification. Moreover, the following description of the exemplary embodiments is merely illustrative and is in no way intended to limit the invention and the application or uses thereof. Notice that similar reference numerals refer to similar items in the following figures, and thus once an item is defined in one figure, it is possible that it need not be further discussed for following figures.

FIGS. 2A-2D are diagrams showing a process for forming a gate contact hole according to an embodiment of the present invention.

Figure 2A:
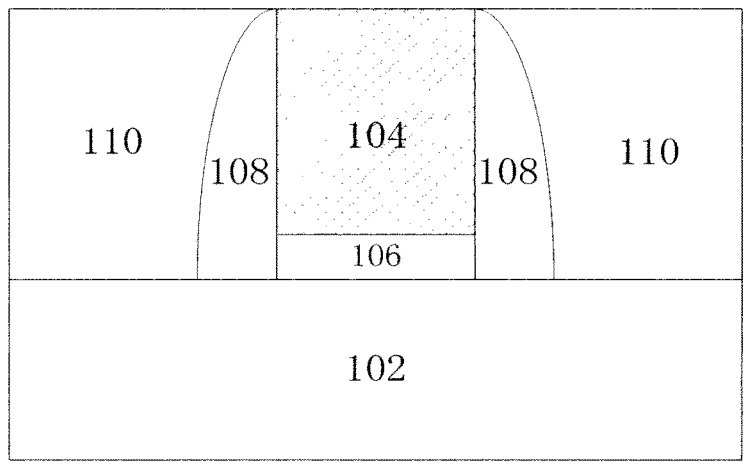
FIGS. 2A-2D are diagrams showing a process for forming a gate contact hole according to an embodiment of the present invention.

Similar to FIG. 1A, in FIG. 2A, a substrate 102 with a first dielectric layer 110 and a gate 104 is provided, wherein, optionally, the gate 104 can be flush with an upper surface of the first dielectric layer 110 and an upper surface of the gate 104 is exposed by way of processes such as chemical mechanical polishing (CMP). The gate 104 can be formed from any suitable metal and/or a combination of metals. In this embodiment, an upper portion of the gate 104 is aluminium, while a lower portion of the gate 104 can be either aluminium or other suitable materials.

Figure 2B:
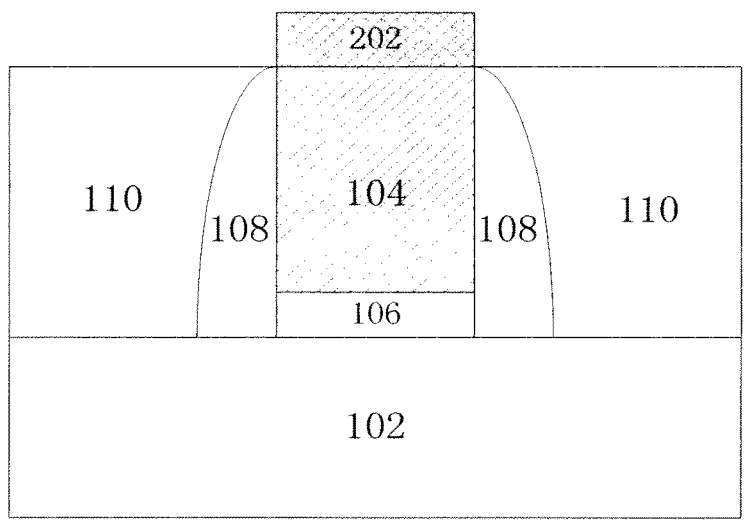

Next, the exposed aluminium is covered with a layer of conductive material 202 by a selective deposition. Note that, since aluminium is easy to be oxidized in air, it is preferred that a step of selectively depositing the conductive material 202 is performed immediately after the chemical mechanical polishing (CMP) process, or that the semi-finished product is maintained in vacuum or in a non-oxidizing atmosphere like inert gases. In other words, preferably, the step of depositing the conductive material is performed under a situation where the surface of aluminium is not oxidized. As shown in FIG. 2B, the conductive material 202 merely covers the exposed aluminium but does not cover the first dielectric layer 110. The conductive material 202 should be selected such that it is harder to be oxidized than the exposed metal (aluminium in this example) of the upper portion of the gate. Preferably, the conductive material 202 is selected such that it is substantially not oxidized in an atmosphere for depositing a second dielectric layer when depositing the second dielectric layer on the conductive material 202 and the first dielectric layer 110 in a subsequent step. As an example, the conductive material 202 can include but is not limited to the following materials: cobalt, an alloy of cobalt and tungsten, an alloy of cobalt and molybdenum, an alloy of cobalt and phosphorus, an alloy of molybdenum and phosphorus, an alloy of cobalt, tungsten and phosphorus, an alloy of cobalt, molybdenum and phosphorus, palladium, or nickel. As would be appreciated by one of ordinary skill in the art, the materials listed above are merely illustrative but not intended to limit the present invention. The thickness of the deposited conductive material 202 can be selected as needed, for example, within a range from 100 Å to 500 Å. Preferably, the conductive material 202 may have a thickness of 200 Å.

Preferably, the selective deposition of the conductive material 202 can be performed by using a selective electroless metal deposition (SEMD) technique. It has been known that conductive material 202 such as metal can be selectively deposited on a conductive surface (such as metal silicide or metal) but not on a dielectric surface (such as silicon oxide or silicon nitride) by using the SEMD technique, which has a high selectivity (for example, see non-patent document: "The Use of Selective Eletroless Metal Deposition for Micron Size Contact Fill", C. S. Wei, D. B. Fraser, A. T. Wu, M. Paunovic and C. H. Ting, Electron Devices Meeting, 1988. IEDM'88. Technical Digest., International, p 446-449; and non-patent document: "Novel Approach to Reduce Source/Drain Series Resistance in High Performance CMOS Devices Using Self-Aligned CoWP Process for 45 nm Node UTSOI Transistors with 20 nm Gate Length", James Pan, Anna Topol, Ingrid Shao, et al. 2006 Symposium on VLSI Technology Digest of Technical Papers, p 184-185, the entire of which herein are incorporated as a part of this specification). Therefore, using SEMD technique to achieve a selective deposition of conductive material 202 can reduce the complexity of the entire process flow.

Figure 1B:
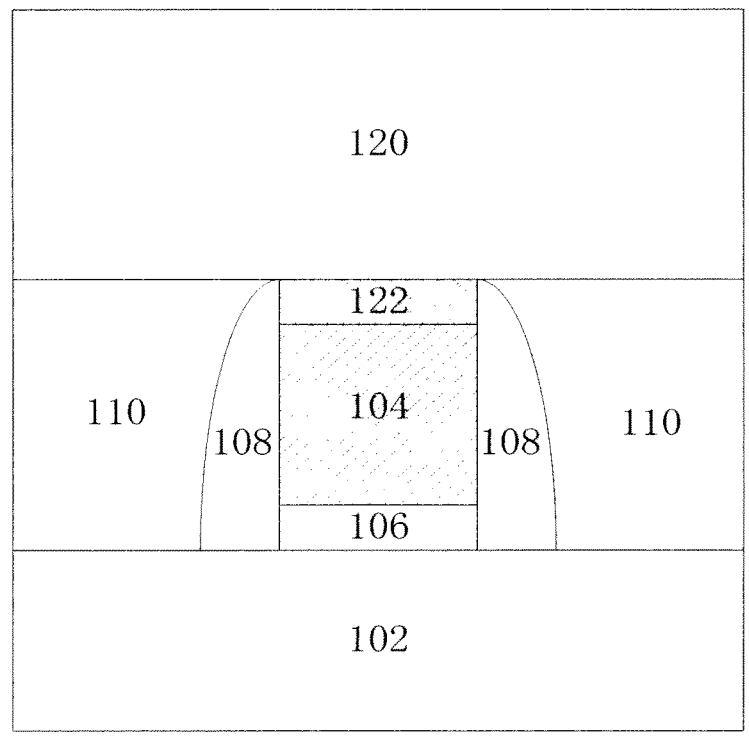
Figure 1C:
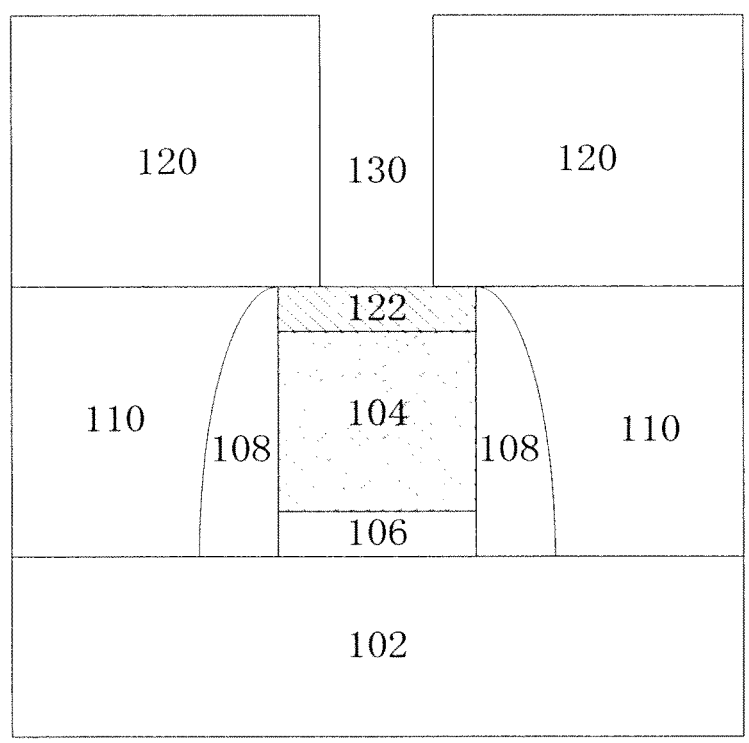
Figure 2C:
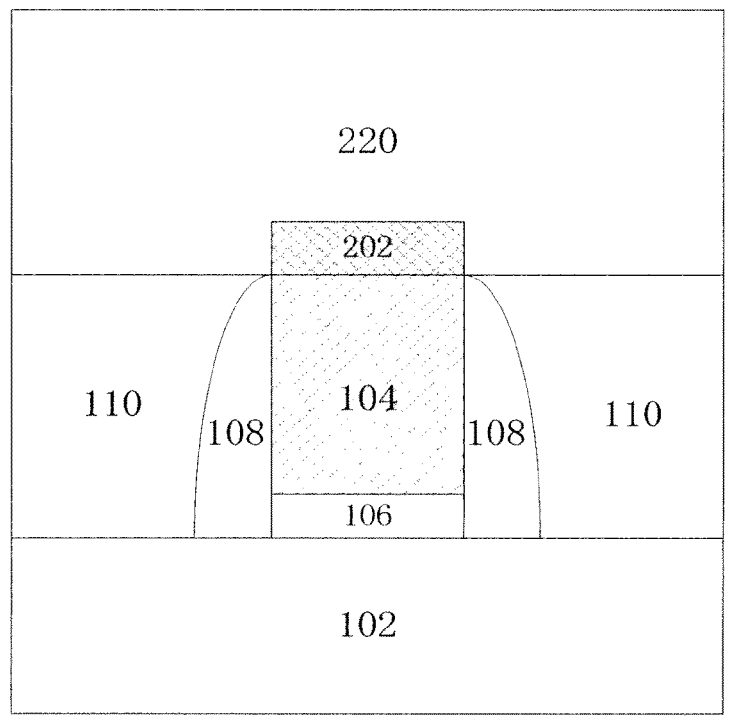

Next, as shown in FIG. 2C, a second dielectric layer 220 is deposited such that the second dielectric layer 220 covers the conductive material 202 on the gate and the first dielectric layer 110. A conventional technique can be employed for the deposition. For example, a manner similar to that used in FIG. 1B for depositing the second dielectric layer 120 can be employed. The technique for depositing the second dielectric layer is well known by one of ordinary skill in the relevant art, and detailed descriptions thereof are thus omitted. For one instance, the reactant for depositing the second dielectric layer can be PE-TEOS (plasma enhanced tetraethyl orthosilicate), and the specific reaction formula can be:

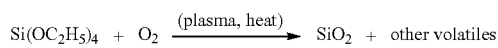

In this embodiment, differing from FIG. 1B, since the aluminium surface of the gate 104 is covered with the conductive material 202, the aluminium is protected from being oxidized during the process of depositing the second dielectric layer 220. Moreover, since the conductive material 202 is properly selected such that it is harder to be oxidized than aluminium, and preferably, the conductive material 202 is substantially not oxidized in an atmosphere for depositing the second dielectric layer, an oxidation film that is hard to be etched will not be formed on the conductive material 202 during the process of depositing the second dielectric layer 220.

Figure 2D:
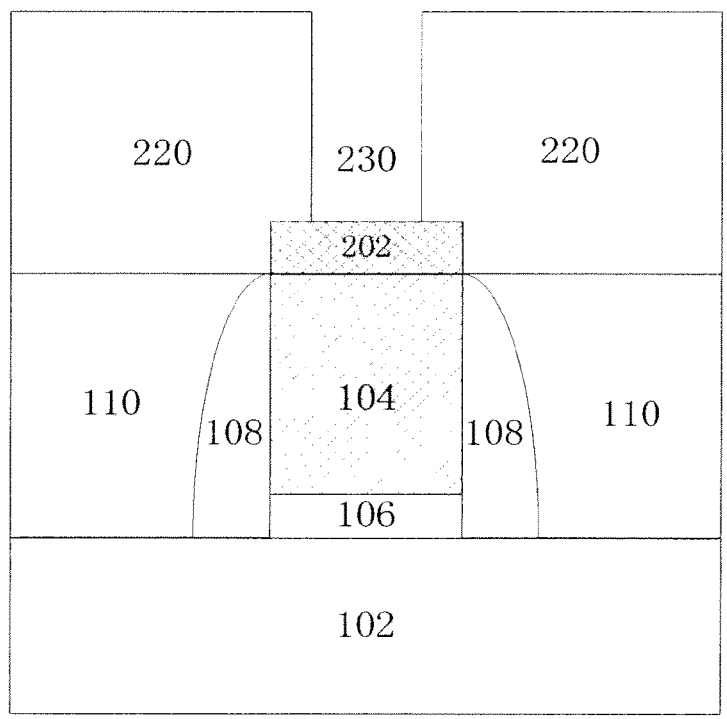

Then, as shown in FIG. 2D, the second dielectric layer 220 is etched to form a gate contact hole 230. In order to avoid excessive details to obscure the concept of the present invention, contact holes to the source and the drain are not shown. However, one of ordinary skill in the relevant art should understand that contact holes to the source and the drain can be formed at this time or can be formed in other steps that before or after the formation of the gate contact hole 230.

Depending on the property of the conductive material 202, the etching may stop on the conductive material 202 or the conductive material 202 may be partially or entirely etched. Preferably, in order to prevent the upper surface of the gate 104 from being further oxidized or taking other reactions in subsequent processes, the etching stops on the conductive material 202 so as to form a gate contact hole 230 (see FIG. 2D). Since the conductive material 202 has good conductivity, the contact that will later be filled in the contact hole 230 can form an effective electrical connection with the gate 104.

Figure 3:
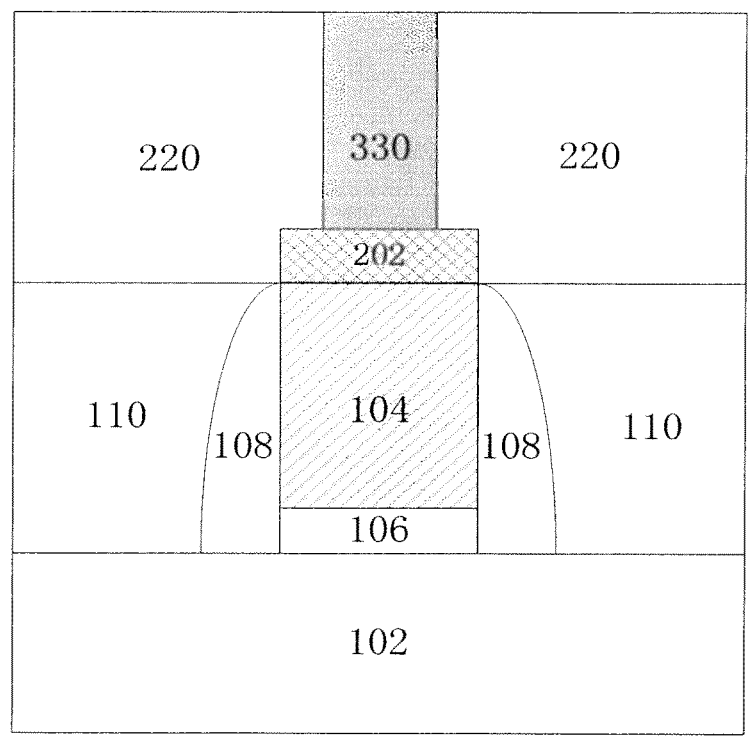
FIG. 3 is a structural diagram showing a semiconductor device according to an embodiment of the present invention.

FIG. 3 is a structural diagram showing a semiconductor device 300 according to an embodiment of the present invention.

As shown in FIG. 3, the semiconductor device 300 comprises: a substrate 102, a metal gate 104 and a first dielectric layer 110 on the substrate 102, a conductive material 202 that covers an upper surface of the metal gate 104, a second dielectric layer 220, and a conductive contact 330. The conductive contact 330 penetrates through the second dielectric layer 220 and is connected to the conductive material 202, so as to effectively electrically connect to the gate 104. There can be a gate dielectric layer 106 of high-K between the substrate 102 and the metal gate 104. Sidewall spacers 108 can be provided on opposite sides of the metal gate 104.

The substrate 102 can be formed from silicon or any other suitable material. The first dielectric layer 110 and the second dielectric layer 220 can be formed from silicon oxide or any other suitable material. The upper portion of the gate 104 is aluminium or any other suitable metal.

It is harder for the conductive material 202 to be oxidized than the metal of the upper portion of the gate 104. Preferably, the conductive material 220 is substantially not oxidized in an atmosphere for depositing the second dielectric layer 220. As described above, the conductive material 202 can include but is not limited to the following materials: cobalt, an alloy of cobalt and tungsten, an alloy of cobalt and molybdenum, an alloy of cobalt and phosphorus, an alloy of molybdenum and phosphorus, an alloy of cobalt, tungsten and phosphorus, an alloy of cobalt, molybdenum and phosphorus, palladium, or nickel. The thickness of the conductive material 202 can be selected as needed, for example, within a range from 100 Å-500 Å.

The conductive contact 330 is generally formed from metal, but can also be formed from any other suitable conductive material. Preferably, the conductive contact 330 and the conductive material 202 are formed from different materials. For example, the material of the conductive contact 330 can be tungsten or copper.

The exemplary embodiments of the present invention have been described above; however, various modes that are different from the above embodiments may be employed to implement the present invention without departing from the spirit of the present invention. For example, in the above embodiments, the conductive material is selectively deposited on the metal gate by way of the SEMD technique. However, the present invention is not limited to this. Alternatively, a layer of conductive material can be uniformly deposited on the first dielectric layer 110 and the gate 104, and then photolithographed and etched with a mask previously used for forming the gate, such that the conductive material 202 merely covers the upper surface of the gate. As another example, although in the above embodiments, the conductive material 202 merely covers the upper surface of the gate, it can also be appropriately extended to partially cover the first dielectric layer 110 without affecting the implementation of the present invention.

Although some specific embodiments of the present invention have been demonstrated in detail with examples, it should be understood by one of ordinary skill in the relevant art that the above examples are only intended to be illustrative but not to limit the scope of the present invention. It should be understood by one of ordinary skill in the relevant art that the above embodiments can be modified without departing from the scope and spirit of the present invention. The scope of the present invention is defined by the claims.

What is claimed is:

1. A method for manufacturing a semiconductor device, comprising:
providing a substrate with a first dielectric layer and a gate, wherein the gate is embedded in the first dielectric layer and an upper portion of the gate is an exposed first metal;
covering only the exposed first metal with a conductive material that is harder to be oxidized than the first metal by a selective deposition; and
depositing a second dielectric layer such that the second dielectric layer covers the first dielectric layer and the conductive material.

2. The method according to claim 1, wherein:
the conductive material is selected to be substantially not oxidized in an atmosphere for depositing the second dielectric layer.

3. The method according to claim 1, further comprising:
etching the second dielectric layer to form a contact hole that exposes the conductive material.

4. The method according to claim 1, wherein:
the first metal is aluminium.

5. The method according to claim 1, wherein:
the conductive material is one of the following materials: cobalt, an alloy of cobalt and tungsten, an alloy of cobalt and molybdenum, an alloy of cobalt and phosphor, an alloy of molybdenum and phosphor, an alloy of cobalt, tungsten and phosphor, an alloy of cobalt, molybdenum and phosphor, palladium, or nickel.

6. The method according to claim 2, wherein:
the conductive material is one of the following materials: cobalt, an alloy of cobalt and tungsten, an alloy of cobalt and molybdenum, an alloy of cobalt and phosphor, an alloy of molybdenum and phosphor, an alloy of cobalt, tungsten and phosphor, an alloy of cobalt, molybdenum and phosphor, palladium, or nickel.

7. The method according to claim 1, wherein:
the conductive material has a thickness of 100 Å~500 Å.

8. The method according to claim 1, wherein:
the first dielectric layer is flush with an upper surface of the gate.

9. The method according to claim 1, wherein:
the step of depositing the conductive material is performed under a situation where the surface of the first metal is not oxidized.

10. The method according to claim 1, wherein:
the conductive material is selectively deposited by using a selective electroless metal deposition technique.

11. The method according to claim 1, wherein, the step of providing the substrate with the first dielectric layer and the gate comprises:
providing sidewall spacers on opposite sides of the gate.

12. A semiconductor device, comprising:
a substrate;
a metal gate and a first dielectric layer on the substrate, wherein the metal gate is embedded in the first dielectric layer and an upper portion of the metal gate is a first metal;
a conductive material that covers an upper surface of the metal gate, wherein the conductive material is harder to be oxidized than the first metal;
a second dielectric layer that covers the first dielectric layer and the conductive material; and
a conductive contact that penetrates through the second dielectric layer and is connected to the conductive material.

13. The semiconductor device according to claim 12, wherein:
the conductive material is selected to be substantially not oxidized in an atmosphere for depositing the second dielectric layer.

14. The semiconductor device according to claim 12, wherein:
the first dielectric layer is flush with an upper surface of the metal gate.

15. The semiconductor device according to claim 12, wherein:
the first metal is aluminium.

16. The semiconductor device according to claim 12, wherein:
the conductive material is one of the following materials: cobalt, an alloy of cobalt and tungsten, an alloy of cobalt and molybdenum, an alloy of cobalt and phosphor, an alloy of molybdenum and phosphor, an alloy of cobalt, tungsten and phosphor, an alloy of cobalt, molybdenum and phosphor, palladium, or nickel.

17. The semiconductor device according to claim 13, wherein:
the conductive material is one of the following materials: cobalt, an alloy of cobalt and tungsten, an alloy of cobalt and molybdenum, an alloy of cobalt and phosphor, an alloy of molybdenum and phosphor, an alloy of cobalt, tungsten and phosphor, an alloy of cobalt, molybdenum and phosphor, palladium, or nickel.

18. The semiconductor device according to claim 12, wherein:
the conductive material has a thickness of 100 Å~500 Å.

19. The semiconductor device according to claim 12, wherein:
sidewall spacers are provided on opposite sides of the metal gate.

* * * * *